United States Patent [19]

Kniese et al.

[11] Patent Number: 4,806,103
[45] Date of Patent: Feb. 21, 1989

[54] HIGH DENSITY EDGECARD CONNECTOR SYSTEM

[75] Inventors: Wolfgang Kniese; Otto Schempp, both of Bad Rappenau, Fed. Rep. of Germany

[73] Assignee: Winchester Electronics, Heilbronn-Biberach, Fed. Rep. of Germany

[21] Appl. No.: 162,187

[22] Filed: Feb. 29, 1988

[30] Foreign Application Priority Data

Mar. 20, 1987 [EP] European Pat. Off. ........ 87104122.4

[51] Int. Cl.⁴ .................. H01R 9/09; H01R 23/70
[52] U.S. Cl. ........................... 439/60; 439/630; 439/636; 439/637
[58] Field of Search .................. 439/60, 62, 65, 74, 439/76, 81, 629, 630, 636, 637

[56] References Cited

U.S. PATENT DOCUMENTS

| | | | |
|---|---|---|---|
| 3,160,455 | 12/1964 | Mayor et al. | 439/60 |
| 3,744,005 | 7/1973 | Sitzler | 439/637 |
| 4,548,452 | 10/1985 | Gillett | 439/60 |
| 4,598,966 | 7/1986 | Boland | 439/636 |
| 4,684,194 | 8/1987 | Jenkins et al. | 439/630 |
| 4,705,338 | 11/1987 | Sitzler | 439/630 |
| 4,720,156 | 1/1988 | Beers | 439/630 |

*Primary Examiner*—Gil Weidenfeld
*Assistant Examiner*—P. Austin Bradley
*Attorney, Agent, or Firm*—Brian L. Ribando

[57] ABSTRACT

A high density edgecard connector system includes a first row of cantilever contacts and a second row of cantilever contacts which are longer than those of the first row. The edgecard includes first and second rows of contact pads which are located differing distances from the bottom of the edgecard. Ribs are mounted on the edgecard between each of the contact pads in the first row and lift the cantilever contacts of the second row away from the surface of the edgecard in order to prevent cross connections between the cantilever contacts of the second row and the contact pads of the first row during insertion or withdrawal of the edgecard into or out of the connector. The ribs include ramps on either end and may be integrally molded with a spine which attaches to the bottom edge of the edgecard.

14 Claims, 3 Drawing Sheets

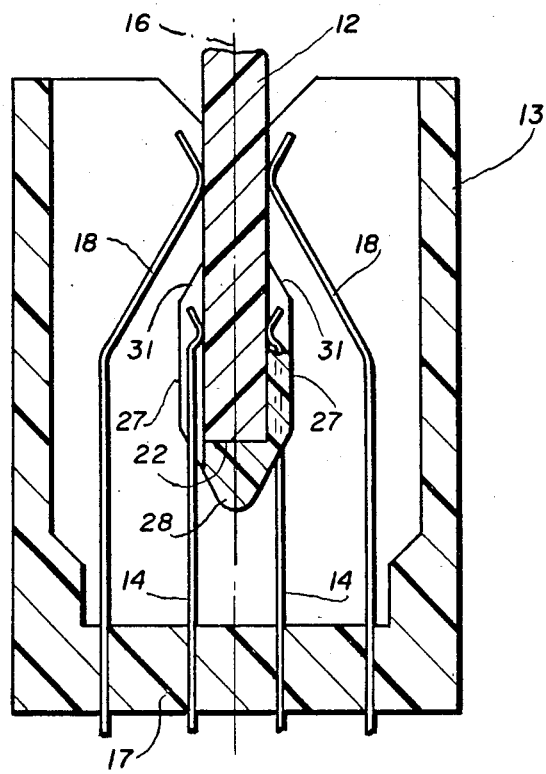
Fig_1
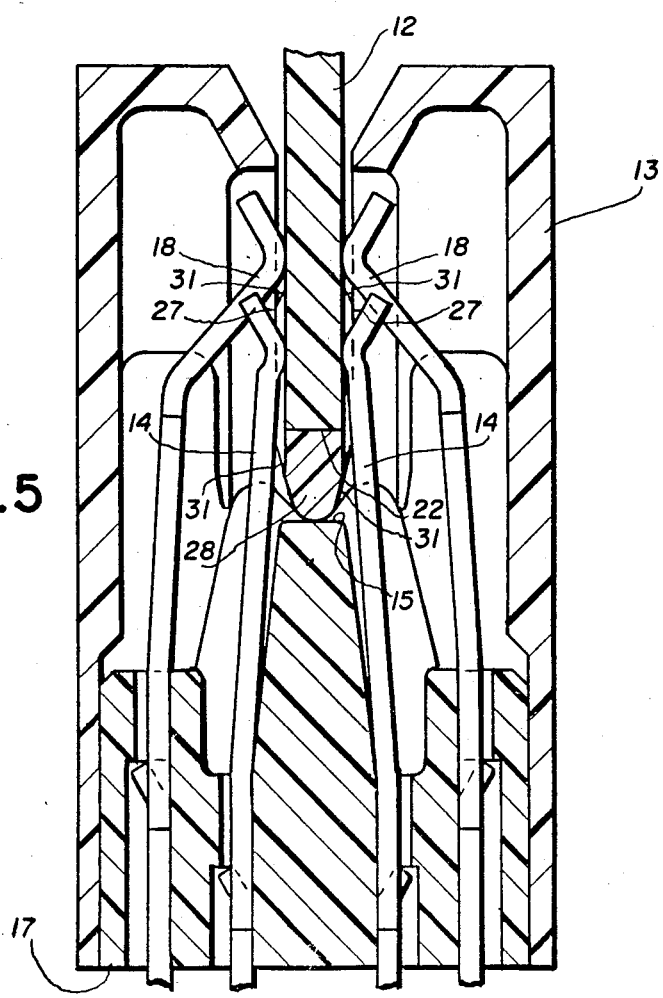
Fig_5

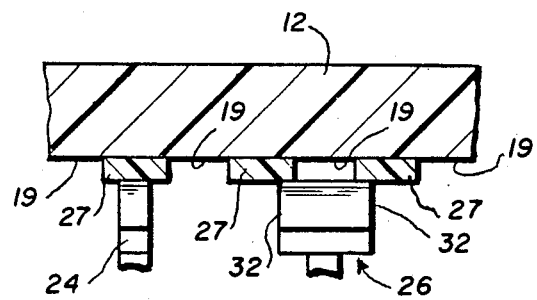
Fig_2A
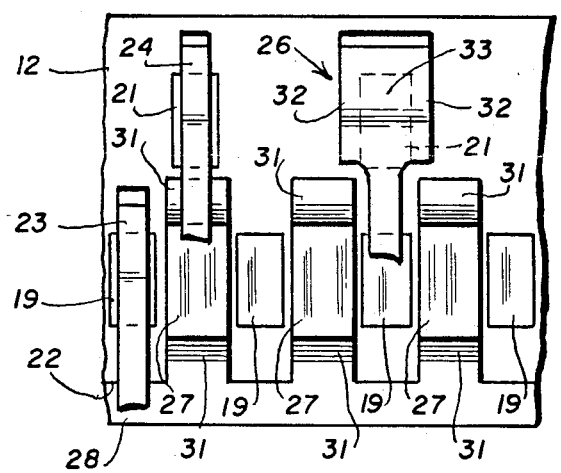
Fig_2B
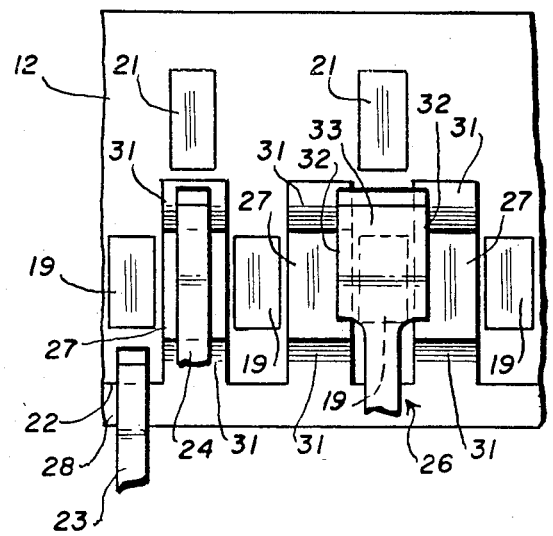
Fig_2C

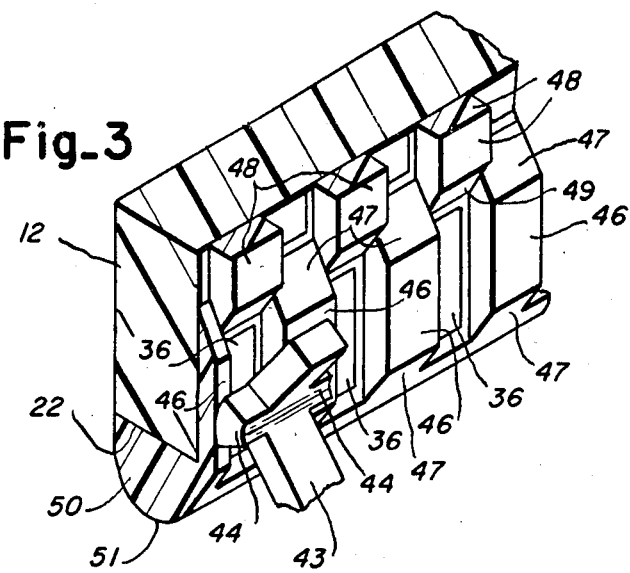
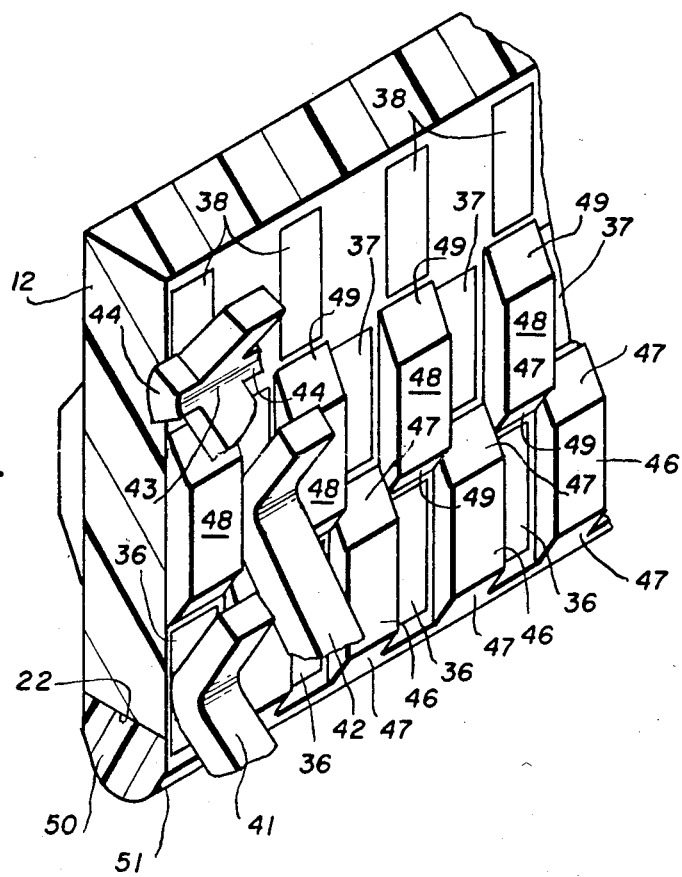

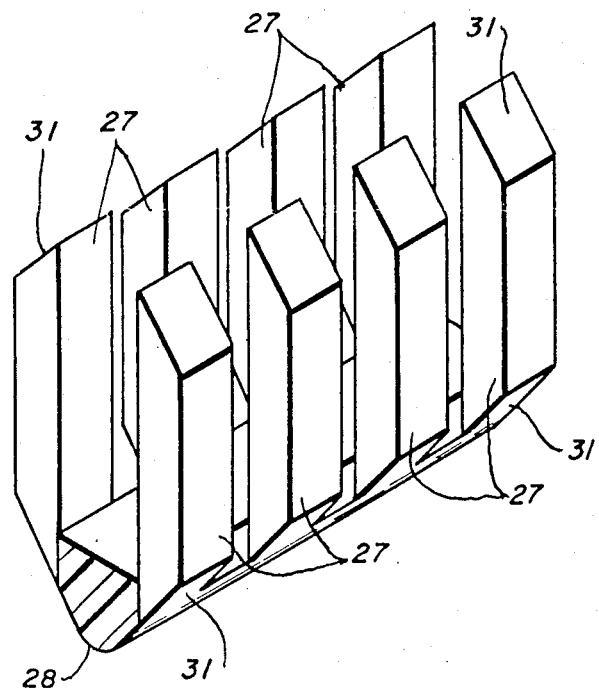
Fig_6

HIGH DENSITY EDGECARD CONNECTOR SYSTEM

BACKGROUND OF THE INVENTION

The invention relates to a high density edgecard connector system having interleaved cantilever contacts in the connector and a comb-like device on the circuit board to prevent cross connections between the cantilever contacts and contact pads on the circuit board.

Edgecard connectors are used to couple daughter boards to mother boards in electronic devices which are equipped with a plurality of such circuit boards. In such arrangements, when the daughter board is inserted into the edgecard connector, a row of cantilever contacts in the connector makes contact with adjacently arranged contact pads on one side of the daughter board; and an opposed row of cantilever contacts in the connector makes contact with contact pads on the opposite side of the daughter board. Due to the continuously advancing miniaturization of electronic components and assemblies and the increase in packing density, however, it would be desirable to have more contacts in the edgecard connector—for example, in two or more vertically spaced rows. However, if the daughter board is pulled from a live system, that is to say one which is under power, cross connections will be made between the vertical rows of contacts and pads. In order to avoid such cross connections in prior art connector designs, a daughter board can only be pulled out of an edgecard connector when the system is switched off.

SUMMARY AND OBJECTS OF THE INVENTION

According to the invention, cross connections are prevented in an edgecard connector which makes direct contact with a circuit board. The connector includes vertically spaced rows of cantilever contacts on both sides of the connector housing, with a first row of shorter contacts located close to the vertical longitudinal center plane of symmetry of the connector shell, and a second row of longer spring contacts spaced from the first. The daughter board is provided on each side with vertically spaced rows of contact pads. The pads of the first row located closest to the circuit board bottom edge are aligned with the first row of cantilever contacts in the connector, and the pads of the second row arranged farther away from the bottom edge are aligned with the second row of cantilever contacts. Ribs which project from the surface of the circuit board are provided between the pads on the circuit board; and when the circuit board is inserted into or pulled out of the connector shell, the ribs raise the longer cantilever contacts of the second row away from the circuit board surface to prevent contact between the second row of cantilever contacts and first row of pads.

In the preferred embodiment, the daughter board is provided with an additional plastic part which mounts on the connection edge of the circuit board and which is formed in the manner of a double-row comb, or if there are three row pairs of spring contacts in the connector shell, in the manner of a double-row grid. The comb teeth or the grid elements raise the cantilever contacts away from the circuit board surface to preclude contact with the pads. When the daughter board is fully inserted into the connector, contact is made between the cantilever contacts and the pads.

It is accordingly an object of the invention to provide several vertically spaced rows of contacts in a connector and an attachment for a circuit board which enables the board to be pulled out or exchanged even in systems under power, without running the risk of an occurrence of unwanted cross connections.

BRIEF DESCRIPTION OF THE DRAWINGS

In the text which follows, advantageous details and illustrative embodiments of the invention are described in greater detail with reference to the drawings, in which:

FIG. 1 is a sectional view of an edgecard connector having vertically spaced rows of cantilever contacts and a circuit board with a ribbed attachment according to the invention.

FIG. 2A is a top sectional view of one side of a circuit board with a comb.

FIGS. 2B and 2C are front views of a circuit board with a ribbed attachment in full engagement and partial engagement, respectively, with the cantilever contacts of a connector according to the invention.

FIG. 3 is a perspective view of a circuit board with plural rows of contact pads in initial engagement with a first row of cantilever contacts.

FIG. 4 is a perspective view of a circuit board with plural rows of contact pads in full engagement with three rows of cantilever contacts.

FIG. 5 is an end view partly in section of an edgecard connector according to the invention having two rows of cantilever contacts on each side of a circuit board.

FIG. 6 is a perspective view of a comb-like structure which attaches to the edge of a printed circuit board.

DESCRIPTION OF THE PREFERRED EMBODIMENT

FIGS. 1 and 5 both show a daughter board or circuit board 12 which is inserted in a connector housing 13.

In the connector housing 13, two opposed rows of first shorter cantilever contacts 14 are positioned at an equal distance from the vertical longitudinal center plane of symmetry 16 of the connector which is perpendicular to the plane of the drawing. The contacts 14 extend through the bottom 17 of the connector housing and may be coupled to a back panel board (not shown). In a corresponding manner but at a greater distance from the plane of symmetry. 16, two opposed rows of longer cantilever contacts 18 are provided which overlap the first rows of contacts 14. The contacts 14, 18 on one side of the line of symmetry 16 can be arranged in the gaps between the respective contacts 14, 18 n the other side of the line of symmetry.. FIG. 5 shows a stop 15 molded into the connector housing 13 which limits the insertion of the circuit board 12 into housing 13.

FIGS. 2B and 2C show a first row of contact pads 19 and a second row of contact pads 21 located further from the bottom edge 22 of the circuit board than the first row of pads 19. As shown in FIG. 2B, when the circuit board 12 is fully inserted into the connector housing 13, the shorter cantilever contact 23 engages the contact pad 19. The longer cantilever contacts 24 and 26 make contact with the row of contact pads 21 which are located further from the bottom edge 22 of the circuit board.

To prevent contact between the longer cantilever contacts 24, 26 and the first row of contact pads 19 as the circuit board 12 is inserted into or pulled out of the connector housing, the following construction is used.

Between the contact pads 19, a row of hump-like elements or ribs 27 projects from the surface of the circuit board 12. The ribs 27 are joined to one another by mean-s of a common spine 28 to form a comb-like component best seen in FIG. 6 which can be molded as an integral plastic part. The spine 28 holds two rows of comb teeth or ribs 27 which as shown in FIG. 1 or 5 are separated by the thickness of the circuit board 12. The single plastic part comprising the spine 28 and the ribs 27 is mounted on the lower edge 22 of the circuit board 12 in such a manner that the ribs 27 are located in the gaps between the contact pads 19. The ribs 27 are formed with ramps 31 at either end which are engaged by the second row 24, 26 of cantilever contacts.

FIG. 2B shows a circuit board 12 fully engaged with a set of cantilever contacts, and FIG. 2C shows the circuit board 12 partially engaged with the cantilever contacts. As shown in FIG. 2C, as the engagement of the circuit board 12 with the cantilever contacts is increased, the longer cantilever contacts 24, 26 slide over the ramps 31 onto the ribs 27 and during this process are lifted away from the surface of the circuit board 12 so that contact between the pads 19 and the contacts 24, 26 is avoided.

As shown in FIG. 2B, when the circuit board is fully engaged with the cantilever contacts, the cantilever contacts 24, 26 slide back onto the surface of the circuit board 12 over the ramps 31 and into contact with the second row of contact pads 21. As the circuit board 12 is pulled out of the connector housing, the cantilever contacts 24, 26 are lifted from the surface of the circuit board 12 by the ramps 31 to prevent unintended contact between the first row of contact pads 19 and the contacts 24, 26.

Thus, the invention makes is possible to engage or disengage a circuit board in a live or powered state without the risk of cross connections between the first row of pads 19 and the longer contacts 24, 26.

As shown in FIGS. 2B and 2C, the cantilever contact 24 is constructed to be uniformly narrow. During insertion or withdrawal of the circuit board from the connector, the contact 24 rides onto the rib 27 which is in direct vertical alignment with the contact 24. In contrast, the spring contact 26 includes widened shoulders 32 on the right and on the left of the central contact area 33. When the circuit board 12 is inserted into or withdrawn from a connector, the shoulders 32 ride onto the two ribs 27 which are in alignment with the shoulders 32 on either side of the contact 26. Unwanted contact between the cantilever contact 26 and the contact pad 19 of the first row is positively prevented. The shoulders 32 may be formed integrally with the contact area 33 or by adding material to the contact area as described below in conjunction with FIGS. 3 and 4. In the case where the cantilever contacts are widened by the shoulders 32, the cantilever contact 26 may be in direct alignment with the contact pad 19 in the lower row since the cantilever contact 26 rides onto the two ribs 27 on either side of the pads 19. Where a narrow cantilever contact 24 is used, the contact 24 must be offset relative to the lower row of pads 19 to prevent contact between the narrow cantilever contact 24 and the pads 19.

FIG. 2A is a top sectional view of one side of a circuit board 12 and the cantilever contacts 24 and 26 as shown in FIG. 2C. The narrow contact 24 is supported directly by the rib 27 to prevent its contact with contact pads 19 on either side of the rib 27. The wide contact 26 is supported on either side by the ribs 27. Thus, although the lower contact pad 19 is located directly beneath the contact 26, the spaced ribs 27 prevent a connection between the two.

FIGS. 3 and 4 show a third embodiment of the invention in which three vertically spaced rows of contact pads 36, 37, and 38 best seen in FIG. 4 are positioned on the printed circuit board 12. The contact pads 36 and 38 in the top and bottom rows are in vertical alignment with one another while the contact pads 37 in the middle row are offset with respect to the pads 36, 38 in the top and bottom rows.

Three rows of cantilever contacts are provided in this embodiment of the invention which is intended for use in narrow space conditions. A first row 41 of short contacts is overlapped by medium length contacts 42 and the latter, in turn, are overlapped by long contacts 43. The short contacts 41 and the long contacts 43 are in vertical alignment with one another while the medium contacts 42 are offset or staggered with respect to the vertical alignment of the short contacts 41 and the long contacts 43.

As can be easily seen in FIGS. 3 and 4, the contact areas of the spring contacts 43 are widened by the addition of shoulders 44 to either side of the contacts 43. Insertion or removal of a circuit board in a live system can be performed with this contact arrangement since unintended contact between the cantilever contacts 42, 43 and the contact pads 36, 37 is prevented.

Similar to the embodiment first described with reference to FIGS. 2A-2C, ribs 46 with upper and lower ramps 47 as previously described are provided between the contact pads 36 of the first (bottom) row. The contact pads 37 of the second (center) row are aligned with the gaps between the contact pads 36 of the first (bottom) row. Ribs 48 having upper and lower ramps 49 are provided between the contact pads 37. The contact pads 36 are in vertical alignment with the ramps 49 of the ribs 48.

The ribs 46 of the first (bottom) row may be connected in the area of their side edges to the ribs 48 of the second (upper) row, thus allowing the first and second rows of ribs 46 and 48 to be integrally molded with the spine portion 50. The molded plastic part including the spine 50 and the ribs 46 and 48 is fitted onto the bottom edge 22 of the circuit board and presents a sloped or rounded front edge 51 allowing the circuit board 12 to be inserted without difficulty into the top opening of a connector housing 13. Thus, the ribs 46 of the bottom row, together with the staggered and integrally connected ribs 48 of the top row on one side of the printed circuit board are connected by the spine 50 to the corresponding ribs 46, 48 on the opposite side of the circuit board to from a type of double-rowed grid arrangement which can be produced as an integral molded plastic part.

MODE OF OPERATION OF THE PREFERRED EMBODIMENT

The plug connector combination with the three-row spring contact arrangement according to the embodiment of FIGS. 3 and 4 insures safe insertion or withdrawal of the circuit board 12 without unwanted contact between the cantilever contacts 42, 43 and the contact pads 36, 37 even with live systems as described below.

As the circuit board 12 of FIG. 4 is inserted into a connector housing (not shown), the shoulders 44 of the long cantilever contacts 43 ride onto the ramps 47 of two ribs 46 of the bottom row and during this process are lifted from the surface of the circuit board to prevent contact between contacts 43 and lower row of of contact pads 36. As the circuit board 12 is inserted further into the connector housing, the ribs 48 of the second (top) row next become effective with respect to the longest cantilever contacts 43 and again hold the contacts 43 spaced from the circuit board 12 to prevent contact between the contacts 43 and the center row of contact pads 37. When the circuit board 12 is fully inserted into the connector housing, the cantilever contacts 43 slide down the ramps 49 and come into contact with the third row of contact pads 38.

A similar process occurs with the cantilever contacts 42 in the second row. During the insertion of the circuit board 12 into the connector housing, the ramps 47 of the ribs 46 lift the contacts 42 from the surface of the circuit board to prevent contact between the contacts 42 and the contact pads 36. When the circuit board is completely inserted, the desired connections are made between the medium length contacts 42 and the second row of contact pads 37.

Finally, the bottom row of cantilever contacts 41 contact the bottom row of contact pads 36 when the circuit board 12 is completely inserted into the connector housing.

The daughter board connector combination according to the invention is mainly characterized by the ability to connect a plurality of circuits in the narrowest space without cross-connecting circuits when the circuit board is inserted into or withdrawn from the connector allowing circuit boards to be exchanged in systems which are under power.

Having thus described the invention, various alterations and modifications will be apparent to those skilled in the art, which alterations and modifications are intended to be within the scope of the invention as defined by the appended claims.

What is claimed is:

1. A high density edgecard connector system including a connector housing having an opening for receiving the bottom edge of a circuit board, the system comprising:
    a first and second row of cantilever contacts mounted in the connector, the contacts in the second row having a length which is greater than the length of the contacts in the first row;
    a first and second row of contact pads on a first side of the circuit board, the contact pads of the second row being spaced a greater distance from the bottom edge of the circuit board than the contact pads of the first row;
    a series of ribs which project from the surface of the circuit board and are positioned one each between the contact pads of the first row, wherein the ribs lift the cantilever contacts of the second row from the surface of the circuit board to prevent contact between the cantilever contacts of the second row and the contact pads of the first row.

2. The high density edgecard connector system of claim 1 wherein at least one of the ribs is in vertical alignment with one of the contact pads in the second row.

3. The high density edgecard connector system of claim 1 where at least one of the ribs is in vertical alignment with a space between two of the contact pads in the second row.

4. A high density edgecard connector system of claim 1 further comprising:
    first and second rows of contact pads formed on a second side of the circuit board; and
    a series of ribs which project from the surface of the circuit board and are positioned one each between the contact pads in the first row on the second side of the circuit board.

5. The high density edgecard connector system of claim 4 further comprising:
    a spine connecting each of the ribs, wherein the spine is mounted on the bottom edge of the circuit board and the ribs are arranged in two rows, and wherein the two rows of ribs are spaced apart by a distance which is equal to the thickness of the circuit board.

6. The high density edgecard connector system of claim 1 further comprising:
    ramps formed on the ends of each rib for smoothening the transition between the surface of the circuit board and the rib.

7. The high density edgecard connector system of claim 6 further comprising:
    a spine connecting each of the ribs, wherein the spine and the ribs are integrally formed, and the spine is mounted on the bottom edge of the circuit board.

8. The high density edgecard connector system of claim 7 further comprising:
    a rounded edge formed on the bottom edge of the spine.

9. The high density edgecard connector system of claim 7 further comprising:
    shoulders on the contact end of at least one contact of the second row, wherein the distance between two adjacent ribs is bridged by the shoulders.

10. A high density edgecard connector system including a connector housing having an opening for receiving the bottom edge of a circuit board, the system comprising:
    a first, second, and third row of cantilever contacts mounted in the connector, the contacts in the second row having a length which is greater than the length of the contacts in the first row, and the contacts in the third row having a length which is greater than the contacts in the second row;
    a first, second, and third row of contact pads on the first side of the circuit board, the contact pads of the second row being spaced a greater distance from the bottom edge of the circuit board than the contact pads of the first row, the contact pads of the third row being spaced a greater distance from the bottom edge of the circuit board than the contact pads of the second row; and
    a first series of ribs which project from the surface of the circuit board and are positioned one each between the contact pads of the first row, and a second series of ribs which project from the surface of the circuit board and are positioned one each between the contact pads of the second row, wherein the first series of ribs lift the cantilever contacts of the second and third rows from the surface of the circuit board to prevent cross connections between the cantilever contacts of the second and third rows with the contact pads of the first row, and wherein the second series of ribs lift the cantilever contacts of the third row from the surface of the circuit board to prevent cross connections between the cantilever contacts of the third row with the contact pads of the second row.

11. The high density edgecard connector system of claim 10 wherein the first series of ribs are positioned one each in vertical alignment with the second row of contact pads, and the second series of ribs are positioned one each in vertical alignment with the first and second row of contact pads.

12. The high density edgecard connector of claim 11 further comprising:
shoulders on the contact ends of the cantilever contacts in the third row, wherein the distance between two adjacent ribs in the first row is bridged by the shoulders.

13. The high density edgecard system of claim 12 further comprising:
ramps formed on the ends of each rib for smoothing the transition between the surface of the circuit board and the rib.

14. The high density edgecard connector system of claim 13 further comprising:
a spine connecting each of the ribs of the first row and common areas of contact between the ribs of the first row and the rib of the second row, wherein the spine and the ribs are integrally formed.

* * * * *